United States Patent
Lam et al.

(10) Patent No.: US 10,122,322 B2
(45) Date of Patent: Nov. 6, 2018

(54) DYNAMIC ERROR VECTOR MAGNITUDE CORRECTION FOR RADIO-FREQUENCY AMPLIFIERS

(71) Applicant: SKYWORKS SOLUTIONS, INC., Woburn, MA (US)

(72) Inventors: Lui Lam, Lexington, MA (US); Zhiguo Lai, Acton, MA (US); Andrew Raymond Chen, Newton, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 53 days.

(21) Appl. No.: 15/387,608

(22) Filed: Dec. 21, 2016

(65) Prior Publication Data

US 2017/0187331 A1 Jun. 29, 2017

Related U.S. Application Data

(60) Provisional application No. 62/387,581, filed on Dec. 24, 2015.

(51) Int. Cl.
| | |
|---|---|
| H03F 1/02 | (2006.01) |
| H03F 1/30 | (2006.01) |
| H03F 3/195 | (2006.01) |
| H03F 3/213 | (2006.01) |
| H03F 1/12 | (2006.01) |
| H01L 23/66 | (2006.01) |

(52) U.S. Cl.
CPC ........... *H03F 1/0222* (2013.01); *H01L 23/66* (2013.01); *H03F 1/12* (2013.01); *H03F 1/301* (2013.01); *H03F 3/195* (2013.01); *H03F 3/213* (2013.01); *H01L 2223/6644* (2013.01); *H03F 2200/451* (2013.01)

(58) Field of Classification Search
CPC ...................................................... H03F 1/0222
See application file for complete search history.

(56) References Cited

U.S. PATENT DOCUMENTS

| 5,381,115 A * | 1/1995 | Timmons | H03G 1/04 330/129 |
|---|---|---|---|
| 7,948,317 B2 * | 5/2011 | Wan | H03F 1/302 330/277 |
| 9,209,768 B2 * | 12/2015 | Mehrmanesh | H03G 1/007 |
| 2006/0214730 A1 * | 9/2006 | Yamakawa | H03F 1/301 330/289 |
| 2008/0136518 A1 * | 6/2008 | Iwasaki | H03F 1/3223 330/149 |
| 2010/0102878 A1 * | 4/2010 | Nagata | G01C 19/56 330/86 |

(Continued)

*Primary Examiner* — Patricia T Nguyen
(74) *Attorney, Agent, or Firm* — Chang & Hale LLP

(57) ABSTRACT

Dynamic error vector magnitude correction for radio-frequency amplifiers. In some embodiments, a radio-frequency amplification system can include an amplifier configured to receive an input signal through an input path and generate an amplified signal, a power adjustment component implemented along the input path and configured to adjust power of the input signal, and a control circuit configured to provide a control signal to the power adjustment component based on an operating condition associated with the amplifier, such that an impact of the operating condition on the amplifier is compensated by the adjusted power of the input signal.

13 Claims, 9 Drawing Sheets

(56) References Cited

U.S. PATENT DOCUMENTS

| | | | |
|---|---|---|---|
| 2011/0187461 A1* | 8/2011 | Mochizuki | H03F 3/04 330/310 |
| 2014/0167852 A1* | 6/2014 | Ishigami | H03F 1/0261 330/261 |

* cited by examiner

DYNAMIC ERROR VECTOR MAGNITUDE CORRECTION FOR RADIO-FREQUENCY AMPLIFIERS

CROSS-REFERENCE TO RELATED APPLICATION(S)

This application claims priority to U.S. Provisional Application No. 62/387,581 filed Dec. 24, 2015, entitled DEVM CORRECTION FOR RADIO-FREQUENCY AMPLIFIERS, the disclosure of which is hereby expressly incorporated by reference herein in its respective entirety.

BACKGROUND

Field

The present disclosure relates to dynamic error vector magnitude (DEVM) correction for radio-frequency (RF) amplifiers.

Description of the Related Art

In electronics applications such as wireless applications, a radio-frequency (RF) signal to be transmitted is typically amplified by a power amplifier. When an operating condition changes for the power amplifier, its performance can be degraded. For example, when the power amplifier heats up, its gain can decrease and result in degradation of dynamic error vector magnitude (DEVM).

SUMMARY

In accordance with a number of implementations, the present disclosure relates to a radio-frequency amplification system that includes an amplifier configured to receive an input signal through an input path and generate an amplified signal. The radio-frequency amplification system further includes a power adjustment component implemented along the input path and configured to adjust power of the input signal. The radio-frequency amplification system further includes a control circuit configured to provide a control signal to the power adjustment component based on an operating condition associated with the amplifier, such that an impact of the operating condition on the amplifier is compensated by the adjusted power of the input signal.

In some embodiments, the operating condition can include a temperature associated with the amplifier, such that the control circuit is configured to provide a temperature-dependent control signal. The amplifier can include a power amplifier. The power adjustment component can include a variable attenuator.

In some embodiments, the variable attenuator can include one or more transistors with each having a variable attenuation property dependent on a bias signal. In some embodiments, the transistor can be a complementary metal-oxide-semiconductor transistor. In some embodiments, the variable attenuator can include a plurality of transistors arranged in series. In some embodiments, the variable attenuator can include a plurality of transistors implemented in a pi-configuration, a T-configuration, or a bridge-T-configuration.

In some embodiments, the bias signal provided to the transistor can include the temperature-dependent control signal. The control circuit can be configured to receive a first current representative of the temperature and a reference current, and generate the bias signal. The first current can include a proportional-to-absolute-temperature current, and the reference current includes a band-gap current.

In some embodiments, the variable attenuation property of the transistor can include an increase in gain of the transistor with an increase in temperature. The increase in the gain of the transistor can compensate for a decrease in gain of the power amplifier with the increase in temperature. The compensation of the input signal with a relatively small amplitude can yield a desired gain profile at the output of the power amplifier while avoiding large error vector magnitude impact due to the temperature variation. The increase in the gain of the transistor can be, for example, less than approximately 0.5 dB over the increase in temperature.

In some embodiments, the power amplifier can be configured to amplify a wireless local area network signal. The power amplifier can be further configured to amplify the wireless local area network signal substantially during a burst window of transmission. The burst window of transmission can have a duration of several milliseconds. For example, the burst window of transmission can have a duration of approximately 4 to 5 milliseconds.

In some teachings, the present disclosure relates to a method for processing a signal. The method includes routing the signal through an input path of an amplifier to allow amplification of the signal. The method further includes generating a control signal based on an operating condition associated with the amplifier. The method further includes adjusting power of the signal along the input path such that an impact of the operating condition on the amplifier is compensated by the adjusted power of the signal.

In some implementations, the present disclosure relates to a semiconductor die that includes a semiconductor substrate and a radio-frequency amplification system implemented on the semiconductor substrate. The radio-frequency amplification system includes an amplifier configured to receive an input signal through an input path and generate an amplified signal; a power adjustment component implemented along the input path and configured to adjust power of the input signal; and a control circuit configured to provide a control signal to the power adjustment component based on an operating condition associated with the amplifier, such that an impact of the operating condition on the amplifier is compensated by the adjusted power of the input signal.

In some embodiments, the operating condition can include a temperature associated with the amplifier, such that the control circuit is configured to provide a temperature-dependent control signal. The amplifier can include a power amplifier, and the power adjustment component can include a transistor having a variable attenuation property dependent on a bias signal. The power amplifier can be, for example, a silicon germanium device, and the transistor can be, for example, a complementary metal-oxide-semiconductor device.

According to a number of implementations, the present disclosure relates to a radio-frequency module that includes a packaging substrate configured to receive a plurality of components, and a radio-frequency amplification system implemented on the packaging. The radio-frequency amplification system includes an amplifier configured to receive an input signal through an input path and generate an amplified signal; a power adjustment component implemented along the input path and configured to adjust power of the input signal; and a control circuit configured to provide a control signal to the power adjustment component based on an operating condition associated with the amplifier, such that an impact of the operating condition on the amplifier is compensated by the adjusted power of the input signal.

In some embodiments, the radio-frequency amplification system can be implemented on a common die. In some embodiments, the radio-frequency module can be a front-end module. The front-end module can be configured as, for example, a wireless local area network module.

In some implementations, the present disclosure relates to a wireless device that includes a transceiver configured to generate a signal, and a module in communication with the transceiver and having a radio-frequency amplification system that includes an amplifier configured to receive an input signal through an input path and generate an amplified signal; a power adjustment component implemented along the input path and configured to adjust power of the input signal; and a control circuit configured to provide a control signal to the power adjustment component based on an operating condition associated with the amplifier, such that an impact of the operating condition on the amplifier is compensated by the adjusted power of the input signal. The wireless device further includes an antenna in communication with the module and configured to facilitate transmission of the amplified signal.

In some embodiments, the operating condition can include a temperature associated with the amplifier, such that the control circuit is configured to provide a temperature-dependent control signal. The amplifier can include a power amplifier, and the power adjustment component can include a transistor having a variable attenuation property dependent on a bias signal.

In some embodiments, the module can be a front-end module configured as a wireless local area network module. In some embodiments, the wireless device can further include a cellular power amplifier module configured to amplify a cellular signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
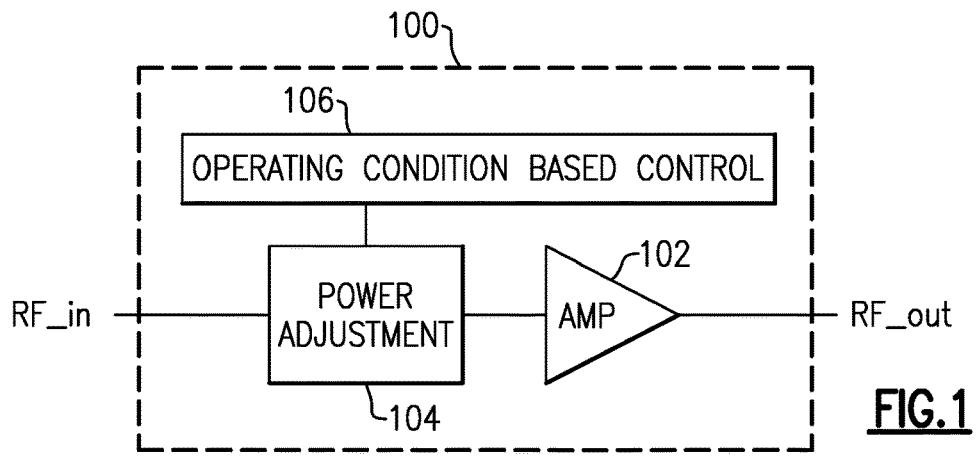
FIG. 1 shows a diagram of a radio-frequency (RF) amplification system configured to receive an input RF signal and generate an amplified output RF signal.

FIG. 1 shows a diagram of a radio-frequency (RF) amplification system 100 configured to receive an input RF signal (RF_in) and generate an amplified output RF signal (RF_out). As described herein, such an RF amplification system can be implemented in one or more devices.

The RF amplification system 100 is shown to include an amplifier 102, and a power adjustment component 104 implemented along an input path to the amplifier 102. Various examples of the amplifier 102 and the power adjustment component 104 are described herein in greater detail.

The RF amplification system 100 is shown to further include an operating condition based control component 106. Such a control component can be configured to provide control for the power adjustment component 104 based on one or more operating conditions associated with the amplifier 102. The control component 106 may or may not provide control for the amplifier 102 itself. Various examples related to the control component 106 are described herein in greater detail.

Figure 2:
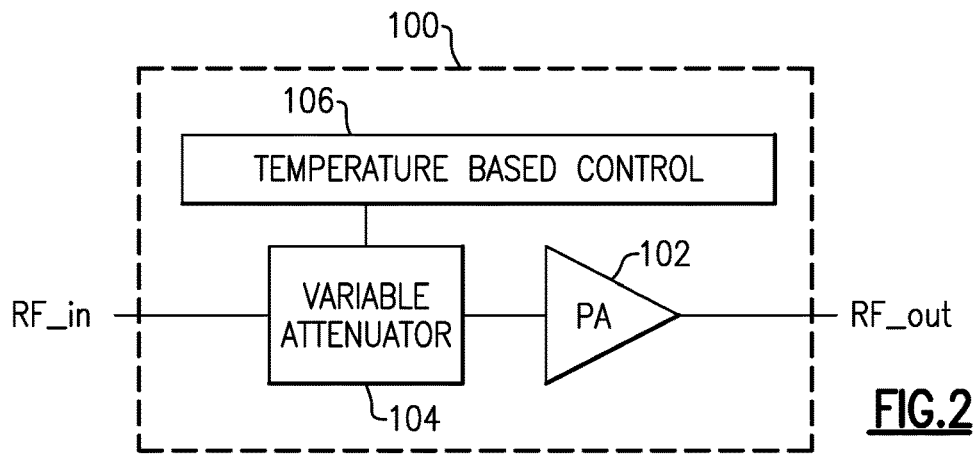
FIG. 2 shows that in some embodiments, the RF amplification system of FIG. 1 can be configured to include a power amplifier, a variable attenuator, and a temperature based control component.

FIG. 2 shows that in some embodiments, the RF amplification system 100 of FIG. 1 can be configured such that the amplifier includes a power amplifier (PA) 102, the power adjustment component includes a variable attenuator 104, and the operating condition based control component includes a temperature based control component 106. Although various examples are described herein in the context of such a combination of components, it will be understood that other combinations can also be implemented. For example, control of the variable attenuator 104 can be implemented with an operating condition other than temperature, or in combination with temperature.

Figure 3A:
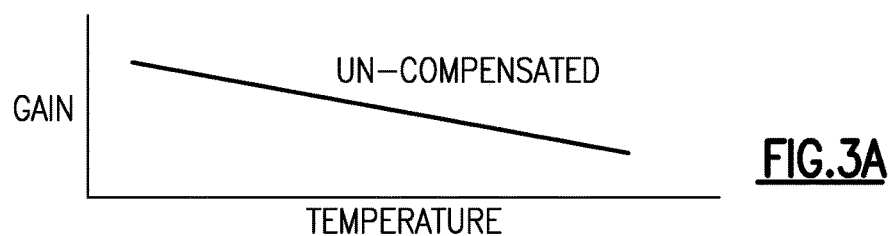
FIG. 3A shows an example of a gain plot for the power amplifier as a function of its operating temperature, when operated without the variable attenuator along its input path.

In the context of the example configuration of FIG. 2, FIG. 3A shows an example of a gain plot for the PA 102 as a function of its operating temperature, when operated without the variable attenuator 104 along its input path (indicated as un-compensated in FIG. 3A). The gain of the PA 102 is shown to decrease as the temperature increases. Such variation in gain can be undesirable in some RF applications.

For example, when a PA is turned on (e.g., for pulse transmission in a wireless local area network (WLAN) application), the PA die typically heats up, and therefore the PA's gain decreases. Such a change in gain of the PA typically results in degradation of performance such as DEVM (dynamic error vector magnitude).

In some applications, such DEVM effects can be corrected by adjusting the PA's bias current based on temperature. Such an approach typically involves a large temperature slope that is sufficiently steep so as to affect static EVM associated with the PA.

As described herein, gain can be adjusted by the variable attenuator 104 of FIG. 2 in a relatively small signal before the PA 102 to compensate for the foregoing gain drop in the PA 102 as the PA heats up. Accordingly, gain can be adjusted (e.g., as a small loss) in the small signal domain, and such an adjustment can yield a desired gain profile (as a function of temperature) for the PA, while avoiding a large signal EVM impact due to the temperature variation.

Figure 3B:
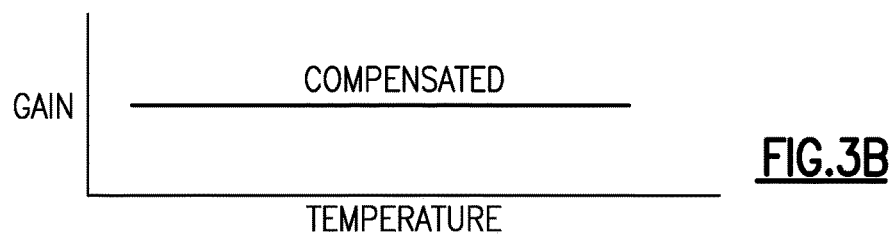
FIG. 3B shows an example of a gain plot for the power amplifier as a function of its operating temperature, when operated with the variable attenuator along its input path.

FIG. 3B shows an example of a gain plot for the PA 102 as a function of its operating temperature, when operated with the foregoing compensation technique using the variable attenuator 104 along its input path. The gain of the PA 102 is shown to remain generally uniform as the temperature varies. Such uniformity in gain can be desirable in many RF applications, including those involving EVM performance.

In the example of FIG. 3B, the compensated gain performance is depicted as having a generally uniform gain over a range of temperature. It will be understood that one or more features of the present disclosure can also be implemented such that the temperature compensated gain profile is not necessarily flat as depicted in FIG. 3B. For example, there may be situations where an increase, uniform, decrease, or any combination thereof for some or all of a temperature range is desired. Such a compensation profile can be achieved by one or more features as described herein.

Figure 4:
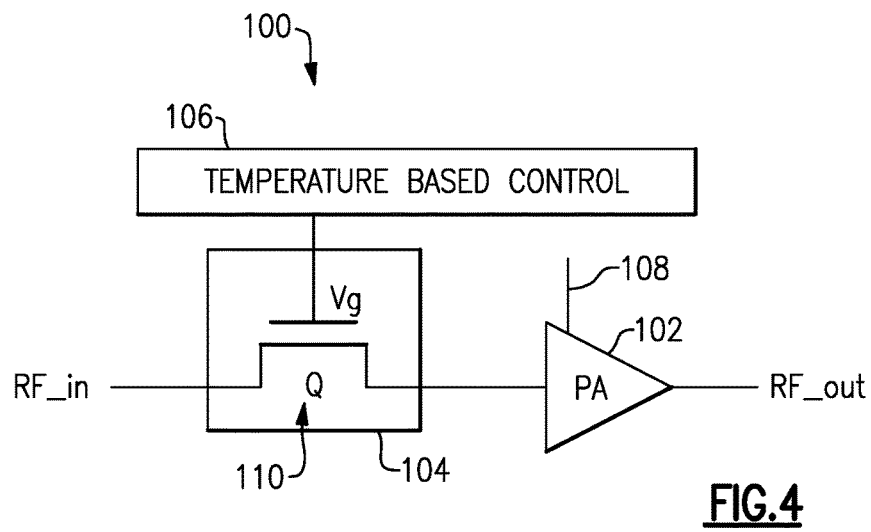
FIG. 4 shows that in some embodiments, the variable attenuator of FIG. 2 and the power adjustment component of FIG. 1 can include a transistor implemented along an input path of a power amplifier.

FIG. 4 shows that in some embodiments, the variable attenuator 104 of FIG. 2 and the power adjustment component 104 of FIG. 1 can include a transistor implemented along an input path of a PA. For example, a PA system 100 is shown to include a PA 102 implemented to receive an input RF signal (RF_in) and generate an amplified output RF signal (RF_out). A transistor Q (110) is shown to be implemented along the input path, such that the input RF signal passes between the transistor's source and drain. Resistance to such passage of the RF signal between the source and drain can be varied by bias voltage (Vg) or bias current applied to the transistor's gate. For the purpose of description, a bias signal can include the foregoing bias voltage (Vg), bias current, or any combination thereof. Accordingly, the transistor 110 can provide functionality of a variable attenuator 104 based on the bias signal.

In the example of FIG. 4, the bias signal applied to the transistor 110 is shown to be provided by a temperature based control circuit 106. Such a circuit can include functionality in which temperature representative of the PA 102 is sensed, and based on such sensed temperature, generate the bias signal. An example of the temperature based control circuit 106 is described herein in greater detail.

In the example of FIG. 4, the PA 102 is shown to be provided with a bias signal 108. Such a bias signal for the PA 102 can be generated separately from the temperature based control circuit 106, partially by the temperature based control circuit 106, substantially fully by the temperature based control circuit 106, or any combination thereof.

In some embodiments, the transistor 110 of FIG. 4 can be, for example, a complementary metal-oxide-semiconductor (CMOS) device. However, it will be understood that other types of transistors can also be utilized to provide one or more functionalities as described herein.

As described herein, application of a variable bias signal to the transistor 110 of FIG. 4 can result in variation in its gain as an RF signal passes through it (e.g., between source and drain). Accordingly, such variation in gain can be utilized to provide variable attenuation functionality.

Figure 5A:
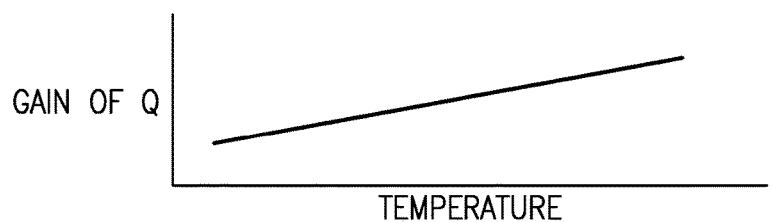
FIG. 5A shows that in some embodiments, control of the biasing of the transistor can be achieved such that that the resulting variation in gain of the transistor is substantially smooth or approximately smooth.
Figure 5B:
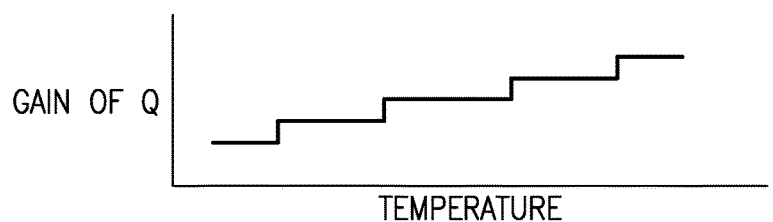
FIG. 5B shows that in some embodiments, control of the biasing of the transistor can be achieved such that that the resulting variation in gain of the transistor is in a number of steps.

As also described herein, such variation in gain can be configured such that the gain increases with increase in temperature. FIGS. 5A and 5B show that such a variable gain profile for the transistor 110 can be implemented in different manners. For example, and as depicted in FIG. 5A, control of the biasing of the transistor 110 can be achieved such that that the resulting variation in gain of the transistor 110 is substantially smooth or approximately smooth. In another example, such fine adjustment of gain may not be necessary or desired. In such a situation, and as shown in FIG. 5B, control of the biasing of the transistor 110 can be achieved such that that the resulting variation in gain of the transistor 110 is in a number of steps. Any combinations of the examples of FIGS. 5A and 5B can also be implemented.

FIGS. 6-10 show non-limiting examples of how one or more transistors can be implemented to provide one or more functionalities of a variable attenuator 104 as described herein. In the examples of FIGS. 6-10, some or all of the transistors can have a resistance that varies with a corresponding bias signal.

Figure 6:
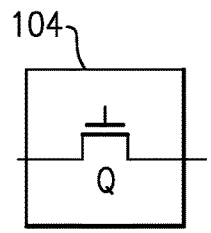
FIG. 6 shows that in some embodiments, a variable attenuator can include a transistor having a resistance that varies with its bias signal.

FIG. 6 shows that in some embodiments, a variable attenuator 104 can include a transistor Q having a resistance that varies with its bias signal. Such a transistor can be implemented so that an RF signal passes through it (e.g., between source and drain) along an input path to a PA.

Figure 7:
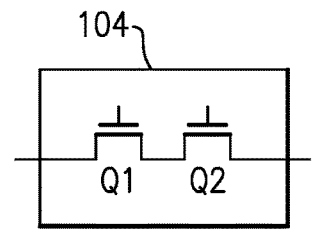
FIG. 7 shows that in some embodiments, a variable attenuator can include a plurality of transistors.

FIG. 7 shows that in some embodiments, a variable attenuator 104 can include a plurality of transistors. Such a transistor can be implemented in series so that an RF signal passes through each one (e.g., between respective source and drain) along an input path to a PA. Some or all of such transistors can have resistance values that vary with respective bias signals.

In some embodiments, a variable attenuator 104 can include a plurality of transistors arranged in parallel. An RF signal can be split into such transistors and be combined into an input of a PA.

Figure 8:
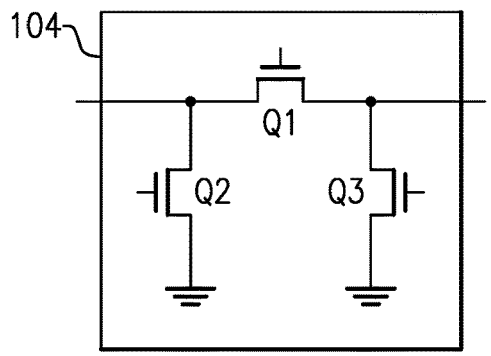
FIG. 8 shows that in some embodiments, a variable attenuator can include a plurality of transistors implemented in a pi-configuration.

FIG. 8 shows that in some embodiments, a variable attenuator 104 can include a plurality of transistors implemented in a pi-configuration. Some or all of such transistors can be provided with temperature based bias signal(s). For example, each of the three transistors Q1, Q2, Q3 can have a resistance value that varies with its bias signal. Such resistance values can be R1, R2, R3, respectively. In a symmetric configuration where R2=R3, pi-attenuator equations can be represented as $R2=R3=R_0(K+1)/(K-1)$, and $R1=R_0(K^2-1)/(2K)$, where K represents the impedance factor and $R_0$ represents the source/load impedance value.

Figure 9:
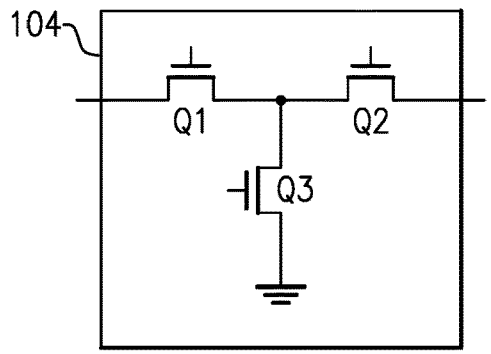
FIG. 9 shows that in some embodiments, a variable attenuator can include a plurality of transistors implemented in a T-configuration.

FIG. 9 shows that in some embodiments, a variable attenuator 104 can include a plurality of transistors implemented in a T-configuration. Some or all of such transistors can be provided with temperature based bias signal(s). For example, each of the three transistors Q1, Q2, Q3 can have a resistance value that varies with its bias signal. Such resistance values can be R1, R2, R3, respectively. In a symmetric configuration where R1=R2, T-attenuator equations can be represented as $R1=R2=R_0(K-1)/(K+1)$, and $R3=R_0(2K)/(K^2-1)$, where K represents the impedance factor and $R_0$ represents the source/load impedance value.

Figure 10:
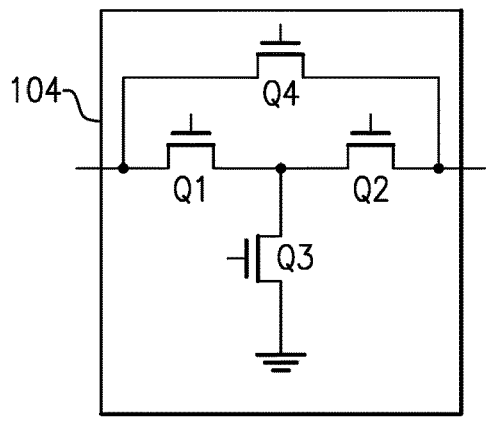
FIG. 10 shows that in some embodiments, a variable attenuator can include a plurality of transistors implemented in a bridge-T-configuration.

FIG. 10 shows that in some embodiments, a variable attenuator 104 can include a plurality of transistors implemented in a bridge-T-configuration. Some or all of such transistors can be provided with temperature based bias signal(s). For example, each of the four transistors Q1, Q2, Q3, Q4 can have a resistance value that varies with its bias signal. Such resistance values can be R1, R2, R3, R4, respectively. In a symmetric configuration where $R1=R2=R_0$, bridge-T-attenuator equations can be represented as $R3=R_0/(K-1)$, and $R4=R_0(K-1)$, where K represents the impedance factor and $R_0$ represents the source/load impedance value.

Other attenuator configurations can also be implemented, with some or all of related transistors being provided with temperature based bias signal(s).

Figure 11:
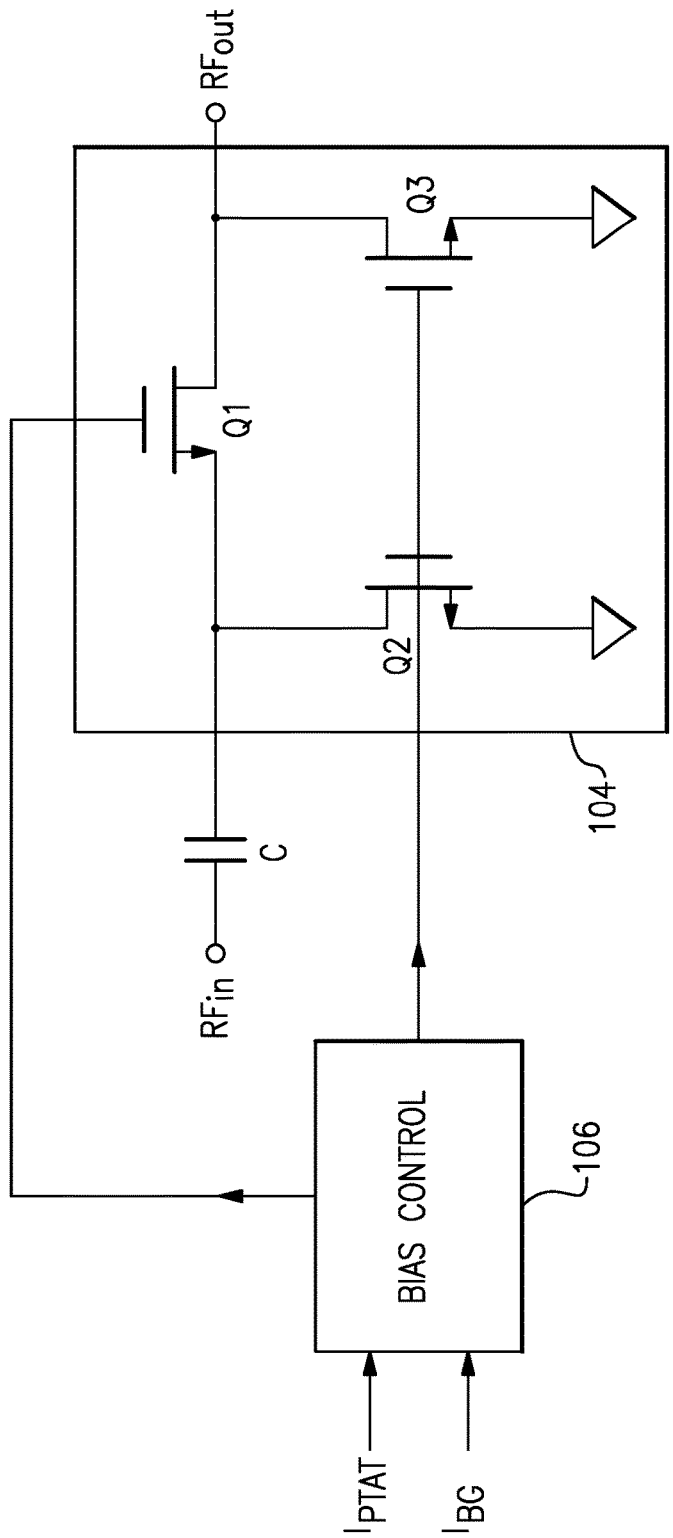
FIG. 11 shows an example where the pi-attenuator of FIG. 8 is biased by a bias control circuit.

FIG. 11 shows an example where the pi-attenuator 104 of FIG. 8 is biased by a bias control circuit 106. In FIG. 11, an input RF signal can pass through, for example, a DC-block capacitance C, and through the attenuator 104 so as to yield an attenuated output which can then be provided to a PA (not shown). In the attenuator 104, each of the three transistors Q1, Q2, Q3 is shown to have its gate provided with a bias signal from the bias control circuit 106.

The example bias control circuit 106 of FIG. 11 is shown to receive $I_{PTAT}$ which is a PTAT current that is proportional to absolute temperature, and $I_{BG}$ which is a band-gap reference current that is generally independent of process, voltage, and temperature variations. Based on such inputs, the bias control circuit 106 can sense variation in temperature, and generate a desired bias voltage for all of the transistors as shown.

As described herein, adjusting an RF signal before it is fully amplified by a PA can be desirable in situations involving performance issues associated with EVM and/or transient effect. However, it will be understood that one or more features of the present disclosure can also be implemented along an output path of a PA. In the context of the former, FIGS. 12-17 show non-limiting examples of how one or more variable attenuators 104 as described herein can be implemented in different configurations. In each of the examples shown in FIGS. 12-17, one or more of such variable attenuators can be implemented before an RF signal undergoes final amplification.

Figure 12:
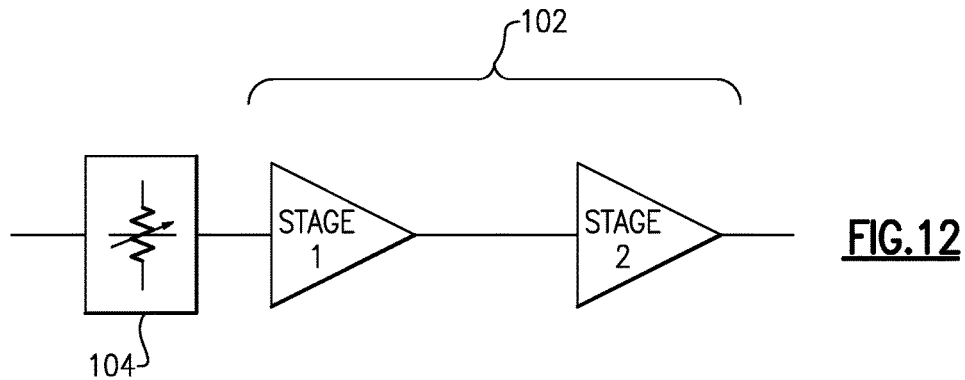
FIG. 12 shows that in some embodiments, a variable attenuator as described herein can be implemented along an input path for a first stage of a power amplifier having a plurality of stages.
Figure 13:
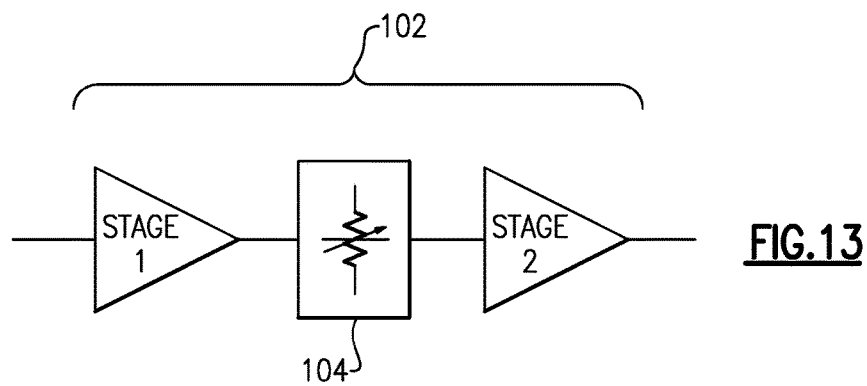
FIG. 13 shows that in some embodiments, a variable attenuator as described herein can be implemented along a signal path between an output of a first stage and an input of a second stage of a power amplifier having a plurality of stages.
Figure 14:
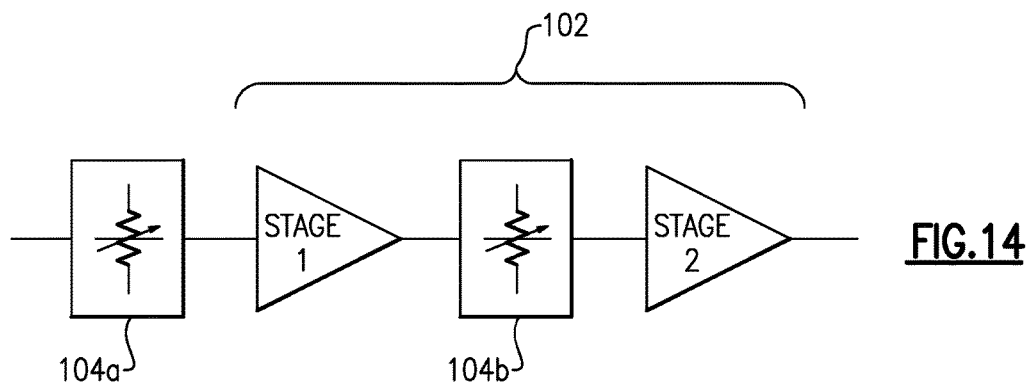
FIG. 14 shows that in some embodiments, a variable attenuator as described herein can be implemented along each of an input path for a first stage and a signal path between an output of the first stage and an input of a second stage of a power amplifier having a plurality of stages.

FIGS. 12-14 show examples in which a PA 102 includes a plurality of stages (e.g., first and second stages). In such a PA, FIG. 12 shows that in some embodiments, a variable attenuator 104 as described herein can be implemented along an input path for the first stage (Stage 1 in FIG. 12). FIG. 13 shows that in some embodiments, a variable attenuator 104 as described herein can be implemented along a signal path between the output of the first stage (Stage 1) and the input of the second stage (Stage 2). FIG. 14 shows that in some embodiments, a variable attenuator 104 as described herein can be implemented along each of an input path for the first stage (indicated as a variable attenuator 104a) and a signal path between the output of the first stage and the input of the second stage (indicated as a variable attenuator 104b). It will be understood that one or more variable attenuators can also be implemented in similar manners in a PA having more than two stages.

Figure 15:
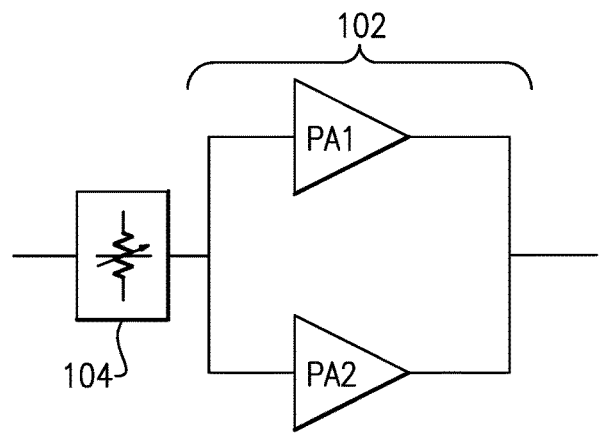
FIG. 15 shows that in some embodiments, a variable attenuator as described herein can be implemented along a common input path, so as to be before a split node, of a power amplifier having a plurality of parallel amplification paths.
Figure 16:
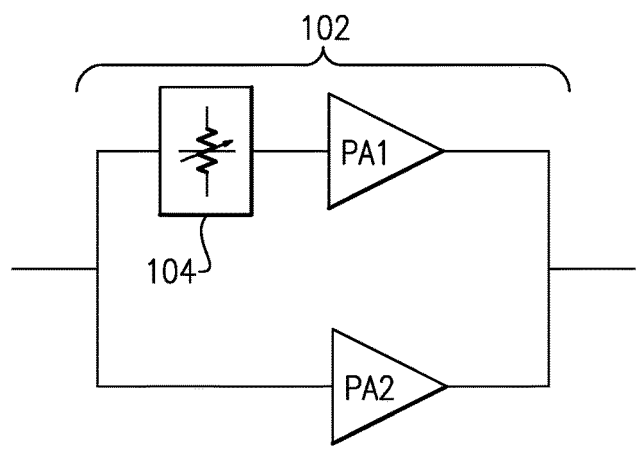
FIG. 16 shows that in some embodiments, a variable attenuator as described herein can be implemented after a split node and along one of a plurality of parallel amplification paths.
Figure 17:
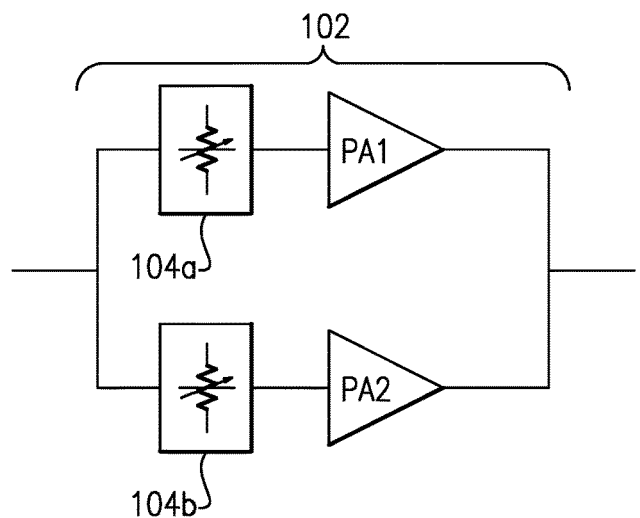
FIG. 17 shows that in some embodiments, a variable attenuator as described herein can be implemented after a split node and along each of a plurality of parallel amplification paths.

FIGS. 15-17 show examples in which a PA 102 includes a plurality of parallel amplification paths. For example, a Doherty PA can include a first amplification path (PA1) for carrier amplification and a second amplification path (PA2) for peaking amplification.

In such an example context, FIG. 15 shows that in some embodiments, a variable attenuator 104 as described herein can be implemented along a common input path, so as to be before a split node. FIG. 16 shows that in some embodiments, a variable attenuator 104 as described herein can be implemented after a split node and before one of the two PAs. For example, a variable attenuator shown to be implemented before the first PA (PA1), but not the second PA (PA2). In another example, a variable attenuator can be implemented before the second PA (PA2), but not the first PA (PA1). FIG. 17 shows that in some embodiments, a variable attenuator 104 as described herein can be implemented after a split node, and before each of the two PAs. For example, a first variable attenuator 104a is shown to be implemented before the first PA (PA1), and a second variable attenuator 104b is shown to be implemented before the second PA (PA2). It will be understood that one or more variable attenuators can also be implemented in similar manners in a PA having more than two parallel amplification paths.

Figure 18:
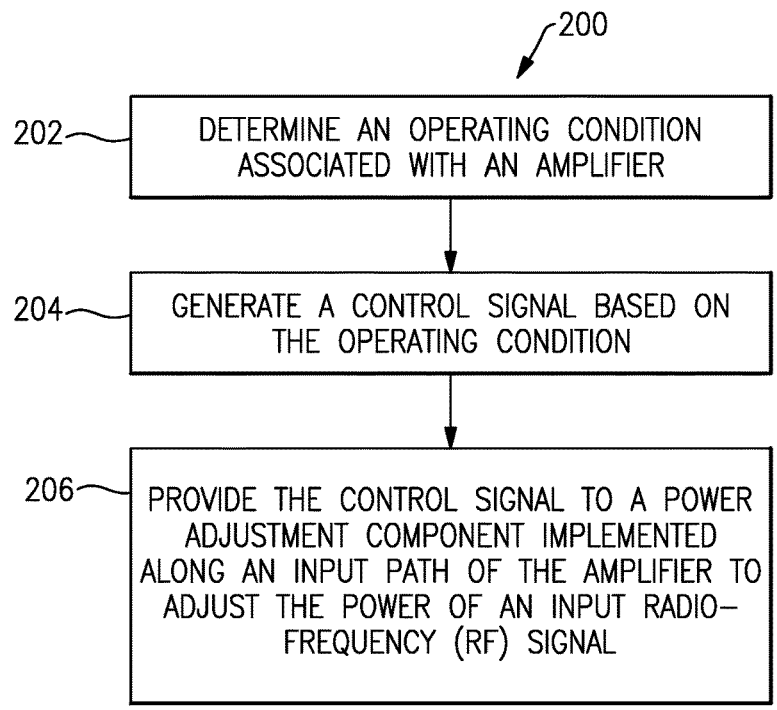
FIG. 18 shows a process that can be implemented to adjust power of an input RF signal to compensate for an operating condition of an amplifier.

FIG. 18 shows a process 200 that can be implemented to adjust power of an input RF signal to compensate for an operating condition of an amplifier. Such a method can be implemented in an RF amplification system similar to the example of FIG. 1. In block 202, an operating condition associated with an amplifier can be determined. In block 204, a control signal can be generated based on the operating condition. In block 206, the control signal can be provided to a power adjustment component implemented along an input path of the amplifier to adjust the power of an input RF signal. As described herein, such an adjustment of the input RF signal can yield a desired compensation of the output RF signal generated by the amplifier.

Figure 19:
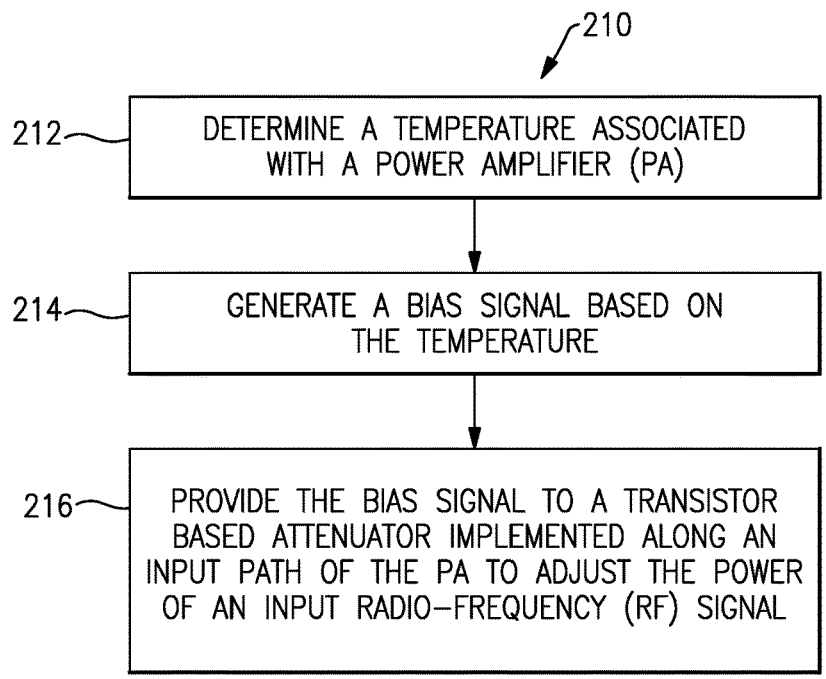
FIG. 19 shows a process that can be implemented to adjust attenuation of an input RF signal to compensate for a temperature condition of a power amplifier.

FIG. 19 shows a process 210 that can be implemented to adjust attenuation of an input RF signal to compensate for a temperature condition of a power amplifier (PA). Such a method can be implemented as a more specific example of the process of FIG. 18. In block 212, a temperature associated with a PA can be determined. In block 214, a bias signal can be generated based on the temperature. In block 216, the bias signal can be provided to a transistor based attenuator implemented along an input path of the PA to adjust the power of an input RF signal. As described herein, such an adjustment of the input RF signal can yield a desired temperature compensation of the output RF signal generated by the PA.

Figure 20:
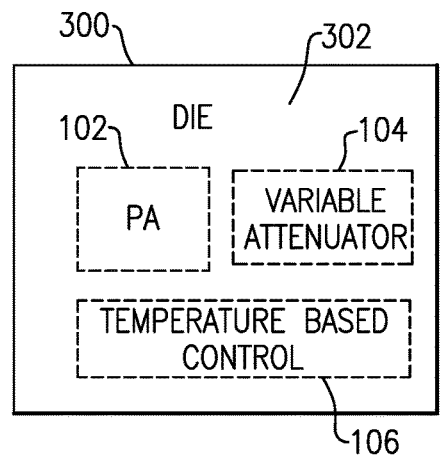
FIG. 20 shows that in some embodiments, a semiconductor die can include a power amplifier as described herein, as well as a variable attenuator also as described herein.

FIG. 20 shows that in some embodiments, a semiconductor die 300 can include a PA 102 as described herein, as well as a variable attenuator 104 also as described herein. In some embodiments, the semiconductor die 300 can also include some or all of a temperature based control circuit 106 as described herein. Such integration of the PA 102, the variable attenuator 104, and the temperature based control circuit 106 on the same die can provide a number of desirable functionalities, including more effective tracking of and/or compensation of conditions such as die temperature, process variation manifested in the die, etc.

In the example of FIG. 20, the semiconductor die 300 is shown to include a substrate 302. In some embodiments, such a substrate can be configured to allow implementation of, for example, silicon germanium (SiGe) PA devices and CMOS devices for the variable attenuator.

Figure 21:
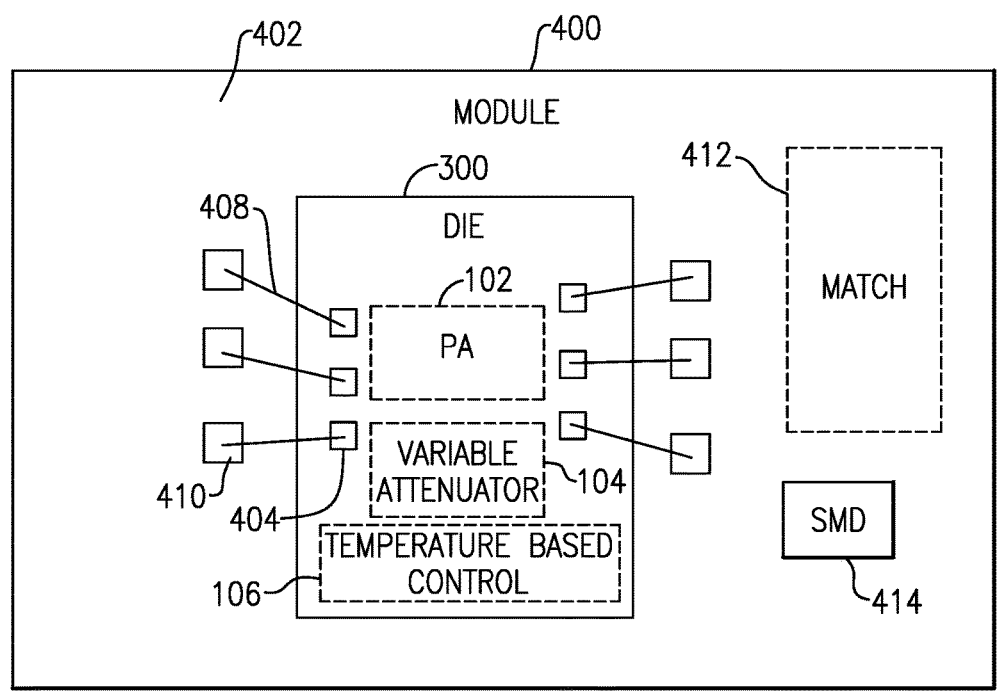
FIG. 21 shows that in some implementations, one or more features described herein can be included in a module.

In some implementations, one or more features described herein can be included in a module. FIG. 21 depicts an example module 400 having a packaging substrate 402 that is configured to receive a plurality of components. In some embodiments, such components can include a die 300 having one or more features as described herein. For example, the die 300 can include a PA 102, a variable attenuator 104, and a temperature based control circuit 106 as described herein. A plurality of connection pads 404 can facilitate electrical connections such as wirebonds 408 to connection pads 410 on the substrate 402 to facilitate passing of various power and signals to and from the die 300.

In some embodiments, other components can be mounted on or formed on the packaging substrate 402. For example, one or more surface mount devices (SMDs) (414) and one or more matching networks (412) can be implemented. In some embodiments, the packaging substrate 402 can include a laminate substrate.

In some embodiments, the module 400 can also include one or more packaging structures to, for example, provide protection and facilitate easier handling of the module 400. Such a packaging structure can include an overmold formed over the packaging substrate 402 and dimensioned to substantially encapsulate the various circuits and components thereon.

It will be understood that although the module 400 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 22:
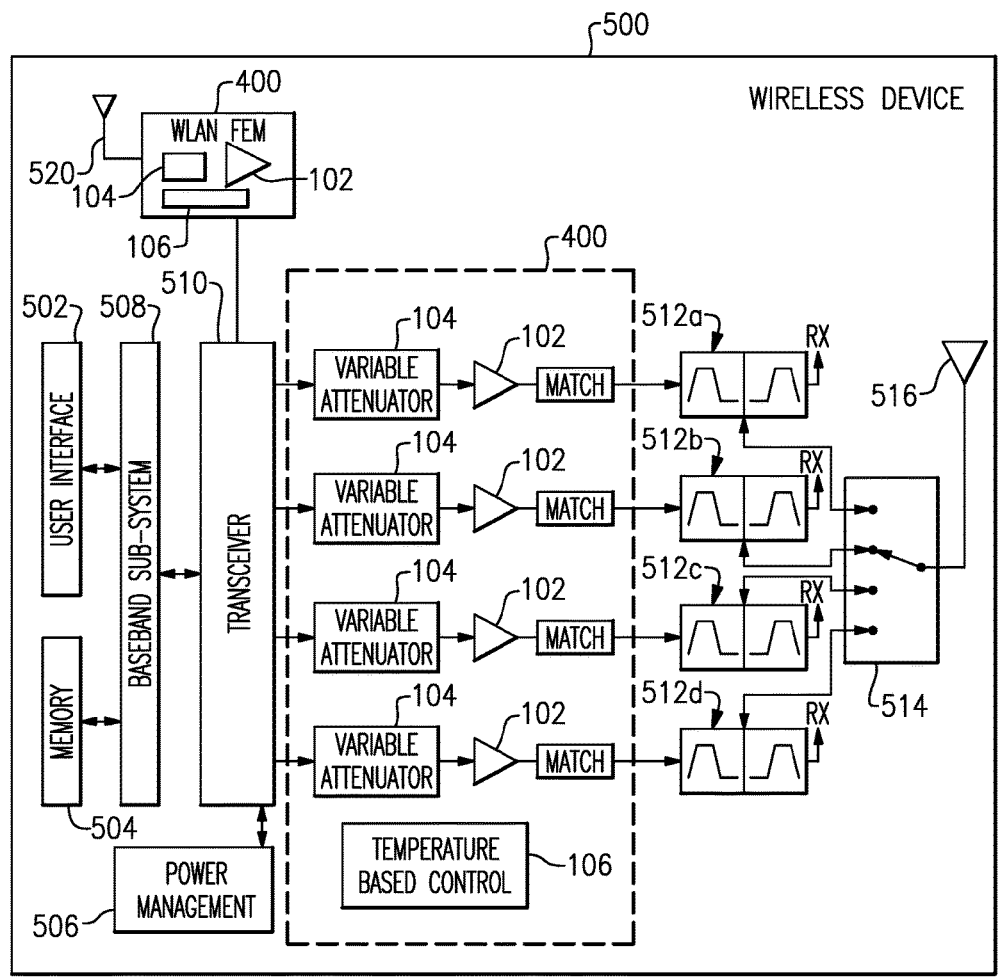
FIG. 22 depicts an example wireless device having one or more advantageous features described herein.

FIG. 22 depicts an example wireless device 400 having one or more advantageous features described herein. One or more PAs 102 as described herein can utilize one or more variable attenuators 104 as described herein. In embodiments where the PAs 102 and their variable attenuators 104 are packaged into a module, such a module can be represented by a dashed box 400. In some embodiments, the module 400 can also include a temperature based control circuit 106 as described herein. The module 400 can also include at least some of output matching circuits.

The PAs 102 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and the module 400.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, outputs of the PAs 102 are shown to be matched and routed to an antenna 516 via their respective duplexers 512a-512d and a band-selection switch 514. The band-selection switch 514 can be configured to allow selection of, for example, an operating band or an operating mode. In some embodiments, each duplexer 512 can allow transmit and receive operations to be performed simultaneously using a common antenna (e.g., 516). In FIG. 22, received signals are shown to be routed to "Rx" paths that can include, for example, a low-noise amplifier (LNA).

As described herein, one or more features of the present disclosure can be beneficial when implemented in WLAN PA applications. Thus, in some embodiments, the wireless device 500 can include a WLAN front-end module (FEM) 400 having a PA 102, a variable attenuator 104, and a temperature based control circuit 106 as described herein. Such a module can be configured as described herein in reference to FIGS. 20 and 21, and be coupled with the transceiver 510 as shown in FIG. 22. The output from the PA 102 of the WLAN module 400 can be transmitted through an antenna 520.

In some embodiments, a wireless device can include a WLAN functionality, but not other wireless functionalities such as cellular functionality. In such embodiments, some or all of the dashed-box module 400 (e.g., associated with cellular capability), as well as downstream components, may be absent from the wireless device 500 of FIG. 22.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency amplification system comprising:
a power amplifier configured to receive an input signal through an input path and generate an amplified wireless local area network signal substantially during a burst window of transmission;
a variable attenuator implemented along the input path and configured to adjust power of the input signal, the variable attenuator including a transistor having a variable gain depending on a temperature-dependent bias signal; and
a control circuit configured to provide the temperature-dependent bias signal to the transistor based on a temperature associated with the power amplifier, such that an impact of the temperature on the power amplifier is compensated by the adjusted power of the input signal.

2. The radio-frequency amplification system of claim 1 wherein the transistor is a complementary metal-oxide-semiconductor transistor.

3. The radio-frequency amplification system of claim 1 wherein the variable attenuator further includes one or more additional transistors arranged in series with the transistor.

4. The radio-frequency amplification system of claim 1 wherein the variable attenuator further includes a one or more additional transistors such that the transistors are implemented in a pi-configuration, a T-configuration, or a bridge-T-configuration.

5. The radio-frequency amplification system of claim 1 wherein the control circuit is configured to receive a first current representative of the temperature and a reference current, and generate the temperature-dependent bias signal.

6. The radio-frequency amplification system of claim 5 wherein the first current includes a proportional-to-absolute-temperature current, and the reference current includes a band-gap current.

7. The radio-frequency amplification system of claim 1 wherein the variable gain of the transistor includes an increase in gain of the transistor with an increase in temperature.

8. The radio-frequency amplification system of claim 7 wherein the increase in the gain of the transistor compensates for a decrease in gain of the power amplifier with the increase in temperature.

9. The radio-frequency amplification system of claim 8 wherein the compensation of the input signal with a relatively small amplitude provides a desired gain profile at the output of the power amplifier while avoiding large error vector magnitude impact due to the temperature variation.

10. The radio-frequency amplification system of claim 9 wherein the increase in the gain of the transistor is less than approximately 0.5dB over the increase in temperature.

11. The radio-frequency amplification system of claim 1 wherein the burst window of transmission has a duration of several milliseconds.

12. A semiconductor die comprising:
a semiconductor substrate; and
a radio-frequency amplification system implemented on the semiconductor substrate, and including a power amplifier configured to receive an input signal through an input path and generate an amplified wireless local area network signal substantially during a burst window of transmission; a variable attenuator implemented along the input path and configured to adjust power of the input signal, the variable attenuator including a transistor having a variable gain depending on a temperature-dependent bias signal; and a control circuit configured to provide the temperature-dependent bias signal to the transistor based on a temperature associated with the power amplifier, such that an impact of the temperature on the power amplifier is compensated by the adjusted power of the input signal.

13. A radio-frequency module comprising:
a packaging substrate configured to receive a plurality of components; and
a radio-frequency amplification system implemented on the packaging substrate, and including a power amplifier configured to receive an input signal through an input path and generate an amplified wireless local area network signal substantially during a burst window of transmission; a variable attenuator implemented along the input path and configured to adjust power of the input signal, the variable attenuator including a transistor having a variable gain depending on a temperature-dependent bias signal; and a control circuit configured to provide the temperature-dependent bias signal to the transistor based on a temperature associated with the power amplifier, such that an impact of the temperature on the power amplifier is compensated by the adjusted power of the input signal.

\* \* \* \* \*